United States Patent [19]

Kunert

[11] Patent Number: 5,682,299
[45] Date of Patent: Oct. 28, 1997

[54] PCMCIA MODULE HAVING MULTIPLE POINT GROUNDING

[75] Inventor: Steven R. Kunert, Cedar Rapids, Iowa

[73] Assignee: Norand Corporation, Cedar Rapids, Iowa

[21] Appl. No.: 466,824

[22] Filed: Jun. 6, 1995

[51] Int. Cl.⁶ .................................................. H05K 9/00
[52] U.S. Cl. .................. 361/816; 361/753; 361/799; 361/800; 174/51; 174/35 GC
[58] Field of Search ..................... 361/737, 741, 361/753, 756, 799, 800, 802, 816, 818, 212, 220; 439/61, 62, 65, 88, 92, 607, 609; 174/35 R, 35 GC, 51; 257/678, 728; 235/380, 388, 387, 492

[56] References Cited

U.S. PATENT DOCUMENTS

| | | |
|---|---|---|
| 4,019,099 | 4/1977 | Calabro .................................. 361/816 |
| 4,780,570 | 10/1988 | Chuck ................................. 174/35 GC |
| 5,055,061 | 10/1991 | Lictenwalter ........................... 439/377 |
| 5,187,648 | 2/1993 | Ito ............................................ 361/816 |
| 5,414,597 | 5/1995 | Lindland et al. ...................... 361/818 |
| 5,467,254 | 11/1995 | Brusati et al. ......................... 361/799 |
| 5,519,577 | 5/1996 | Dudas et al. ........................... 361/816 |
| 5,533,631 | 7/1996 | Marchetti ............................... 361/756 |

Primary Examiner—Leo P. Picard
Assistant Examiner—Anthony Dinkins
Attorney, Agent, or Firm—Suiter & Associates PC

[57] ABSTRACT

A PCMCIA type module provides multiple grounding point to the internal circuit board. The internal circuit board is grounded to an electrically conductive outer housing at a plurality of contact points on the internal frame. The internal frame is electrically conductive and is specially constructed to have multiple ribs which provide multiple contacts from the circuit board to the outer housing.

5 Claims, 2 Drawing Sheets

PCMCIA MODULE HAVING MULTIPLE POINT GROUNDING

CROSS-REFERENCE TO RELATED APPLICATIONS

The present invention may utilize the method and apparatus for electromagnetic shielding and elctrostatic discharge protection of U.S. application Ser. No. 08/419,664 (Attorney Docket No. 38069X) filed Apr. 12, 1995 and assigned to the assignee of the present application. Said application Ser. No. 08/419,664 is hereby incorporated herein by reference in its entirety.

The present invention may be utilized in the data transceiver module having multiple modes of communication for use in a portable hand-held data terminal as disclosed in U.S. application Ser. No. 08/457,697 (Attorney Docket No. 38163) filed Jun. 1, 1995. Said Application Express Mail Label TB 881 383 426 is hereby incorporated herein by reference in its entirety.

TECHNICAL FIELD

The present invention relates generally to PCMCIA modules and specifically to PCMCIA having multiple point grounding for use in portable electronic devices.

BACKGROUND OF THE INVENTION

Hand-held portable data terminals are widely utilized for collecting, processing, storing and transferring data in a variety of applications. Hand-held portable data terminals often utilize a radio frequency (RF) transceiver module for transfer of collected data within a local area network thereby allowing for mobility of the terminal operator within the network and for instant and rapid data transfer. In accordance with Personal Computer Memory Card Association standards, RF transceiver modules are typically constructed within a PCMCIA module for modularity and compatibility with multiple electronic devices.

RF PCMCIA cards transmit and receive electronic data using high frequency radio waves which may become a significant source of interference with the internal circuitry of the RF PCMCIA module itself and with other electronic circuits contained within the portable electronic device in which the RF module is utilized. Additionally, electromagnetic interference from external sources such as other RF transceivers operating in the vicinity may interfere with the electronic circuitry of the RF module as well as with the transmission and reception of electronic data therefrom. Thus, shielding techniques such are necessary to reduce the effects of electromagnetic interference. A grounded barrier enclosure is often utilized for shielding of electronic devices.

The intentional blocking of an electric, magnetic or electromagnetic field is referred to as shielding and is well known in the art. The concept of shielding is founded upon electromagnetic field theory through the application of Gauss' law. Gauss' law states that the net electric flux passing through any closed gaussian (mathematical) surface equals the net charge contained inside that surface divided by the permittivity of free space. Gauss' law is mathematically represented by one of Maxwell's equations, as applied to free space, which describes the net electric flux passing through any closed surface:

$$\oint E \cdot dA = Q/\epsilon_o$$

where E is total electric field intensity at any point on the surface, A is the surface area, Q is the electric charge contained within the surface, and $\epsilon_o$ is the permittivity of free space.

Thus, the net electric flux contained within any gaussian surface is the surface integral of the electric field intensity on the surface which is also equal to the net charge within the surface divided by the permittivity of free space. Shielding employs a continuous metallic conductor as the gaussian surface. When an external field such as from an external source of electromagnetic radiation is applied to the surface the free electrons of the conductor are accelerated due to the externally applied field. The electrons are distributed in such a way that the electric field generated by the electrons opposes the externally applied electric field. The surface charge density then increases until the magnitude of the electric field set up by these charges equals that of the externally applied field, giving a net field of zero inside the conductor. The conductor surface thereby shields the interior of the conductor from the effects of externally applied electric fields.

In a good conductor, the time that it takes the conductor to reach electrostatic equilibrium where there is no net movement of electric charge is on the order of $10^{-16}$, which for practical purposes can be considered instantaneous, that is when the frequency of the externally applied electric field is much less than 10 petaherz ($10^{16}$ Hz). When the conductor is in electrostatic equilibrium the net charge within the conductor is zero.

If the net electric charge within the surface is zero, then the net electric flux will also be zero, and therefore the net electric field is zero everywhere inside the conductor. If the surface is a closed conductive surface, then no charge can enter or leave the surface; all of the charge is contained harmlessly on the surface of the conductor. Thus the net electric charge inside a gaussian surface is zero where the closed gaussian surface comprises a conductor.

No known shielding barrier stops 100 percent of the electromagnetic radiation that it is designed to block. The percent of energy that is blocked is called the shielding effectiveness. Shield continuity, the effectiveness of shielding, is a measure of the degree to which a shield confines or inhibits the electromagnetic field. This parameter depends upon the frequency of the electric field. Shielding becomes less effective with increasing frequencies of the electromagnetic fields such as those typically used in RF PCMCIA modules. Therefore the shield continuity of RF PCMCIA is especially important with RF PCMCIA cards operating at high frequencies.

The effectiveness of an electromagnetic shield is a function of the continuity, or physical completeness, of the barrier. The shield continuity factor is defined as the ratio of the actual shield conductor surface area to the total surface area which the shield area encloses, or:

$$C = A_c/A_t$$

where C is the shield continuity factor, $A_c$ is the surface area of the shield conductor and $A_t$ is the total surface area which the shield encloses.

A solid metal enclosure, with absolutely no holes or gaps and with an excellent conductor provides 100 percent shielding continuity. If there are holes or gaps within the shielding, the effectiveness will be less than 100 percent. If it were possible to build a PCMCIA transceiver module with a continuous, uninterrupted conductive shield, clearly no charge could enter or leave the terminal. Unfortunately, practical PCMCIA modules have electrical input and output paths for data transfer. If the shield enclosure is not continuous, the openings should be very small compared with the wavelength of the electromagnetic field. Consequently, the better the shielding continuity of the PCMCIA module the more closely an ideal closed surface shield is approximated.

Thus, electromagnetic interference generally hampers the function of the printed circuit boards and cards upon which the electronics of a PCMCIA module are mounted. Typical methods known in the art for shielding RF PCMCIA modules may employ grounding the metallic enclosure of the PCMCIA module covering the internal printed circuit board (PCB) by electrically connecting the metallic enclosure to a ground contact on the printed circuit board. Often, the electrical connection is made by soldering metal spring clips to the printed circuit board which are mechanically biased against the enclosure when the PCMCIA module is assembled. Usually only one electrical connection is utilized, with at most four grounding contacts being currently provided by any PCMCIA enclosure supplier. This method of grounding only provides for a few grounding points, is mechanically cumbersome, and does not provide optimal interference protection.

Thus, despite the intense efforts of those skilled in the art, there still exists a need for an RF PCMCIA transceiver module which provides a plurality of grounding contact points more closely approximating an ideal gaussian surface enclosure and which is easy and economical to manufacture.

SUMMARY OF THE INVENTION

The present invention provides multiple grounding points from the circuit board to the outer shell by a plurality of contact points formed on an internal frame.

In a preferred embodiment, the internal frame comprises injection molded plastic electroplated with a conductive material and has a plurality of deflected tabs or ribs which provide contact between the circuit board and the outer housing.

BRIEF DESCRIPTION OF THE DRAWINGS

The numerous objects and advantages of the present invention may be better understood by those skilled in the art by reference to the accompanying figures in which.

DETAILED DESCRIPTION OF AN EXEMPLARY EMBODIMENT

Figure 1:
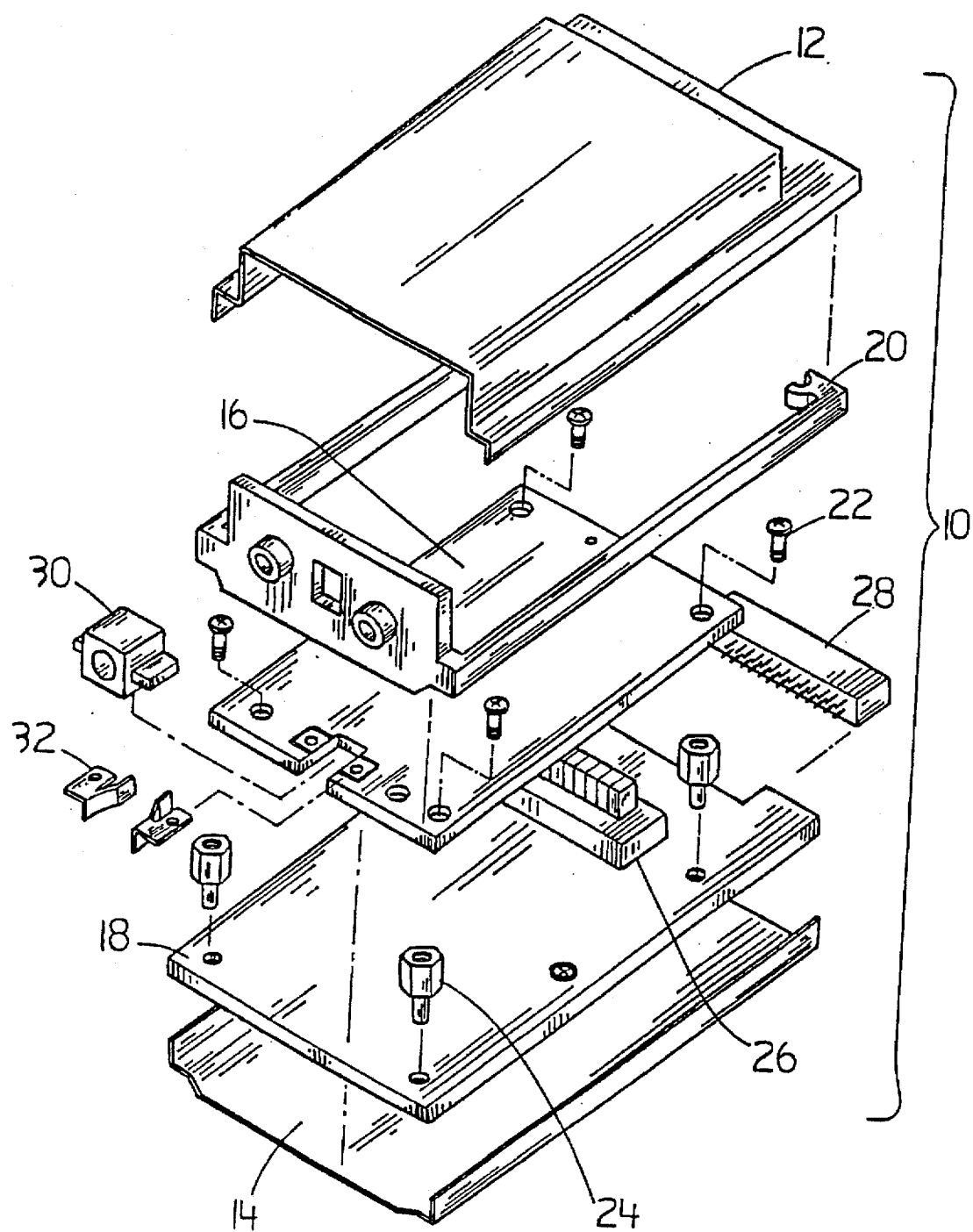
FIG. 1 is an exploded perspective view of a typical assembly for a PCMCIA type module.

FIG. 1 is a perspective illustration of a typical PCMCIA type housing assembly shown in an exploded view. The module 10 shown is a PCMCIA TYPE III configuration housing (10.5 mm in thickness when fully assembled). The assemblies of other PCMCIA standard modules, TYPE II (5.0 mm in thickness) and TYPE I (3.3 mm in thickness), are substantially similar to the TYPE III shown but contained in a correspondingly smaller sized module. The PCMCIA type module 10 generally comprises a top cover 12 and a bottom cover which may be fabricated from tin plated cold rolled steel to form the outer housing for containing the internal components of the module 10. The internal components generally comprise a printed circuit board (PCB) 16 containing the electronics for performing the function for which the PCMCIA module 10 is utilized and an interface card 18 containing the electronics which interface the electronics of the PCB 16 to the electronic device in which the module 10 is utilized.

Typically some sort of internal frame 20 is included in the assembly of the PCMCIA type module 10 to which the printed circuit board (PCB) 16 is mounted, for example with screws 22. Quite often, the frame 20 comprises metal or a strong and durable, robust plastic material and is customized to the particular internal components of the module 10. Setoffs 24 may be utilized to physically hold and separate the interface card 18 from the printed circuit board 16. A board to board connector 26 provides electrical connections from the printed circuit board 16 to the interface card 18. A PCMCIA receptacle 28 provides electrical connection from the interface card 18 to the electronic device in which the module 10 is utilized. Other various internal components may be included in the module 10 if required for the particular application of the module 10. For example, if the PCMCIA module 10 were a radio frequency transceiver, the module 10 may include antenna connector 30 and alternate antenna clips 32 for connection to an antenna.

Figure 2:
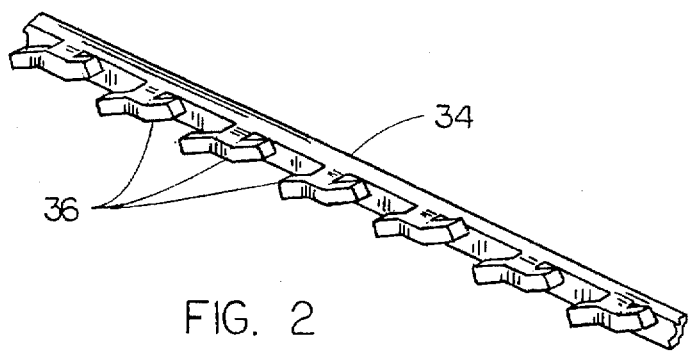
FIG. 2 is an isometric view of one rail of a frame of a PCMCIA type module housing utilizing the present invention.

FIG. 2 is an isometric illustration of one rail of a frame of a PCMCIA type modular housing which utilizes the present invention. The rail 34 may be one of the rails of the PCMCIA TYPE III frame 20 shown in FIG. 1. In a preferred embodiment, the frame 20 including rail 34 is fabricated of an injection molded plastic to obtain the necessary shape and features, and plated with an electrically conductive material such as metal. The rail 34 preferably has formed thereon a plurality of specially shaped and contoured contacts 36, or molded-in ribs. The injection molding process of forming the frame 20 of FIG. 1 and the rail 34 is conducive to producing the contacts 36.

Figure 3:
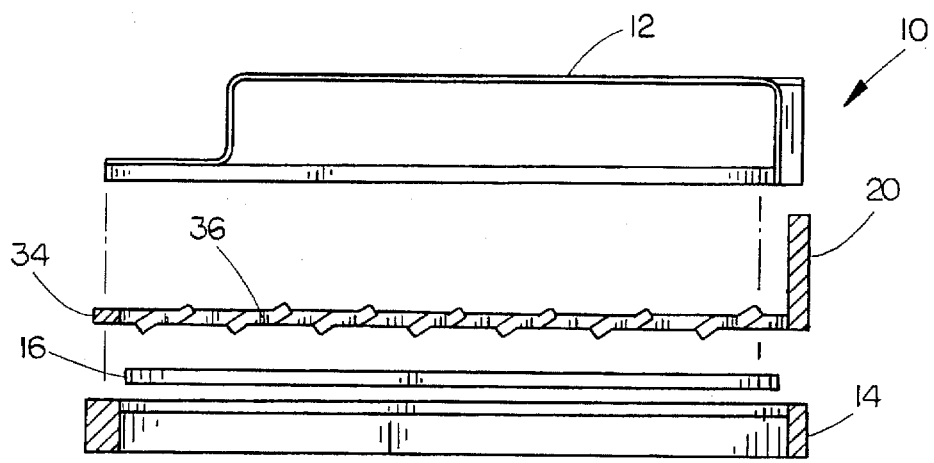
FIG. 3 is a side elevation view of an assembly of a PCMCIA type module housing utilizing the present invention.

FIG. 3 is a side elevation cutaway view of an assembly of a PCMCIA module 10 utilizing the present invention. The assembly of the module 10 FIG. 3 is substantially similar to the assembly of the module 10 shown in FIG. 1. The injection molded frame 20 preferably includes rails 34 having a plurality of contacts thereon. The frame 20 preferably attaches to a top cover 12 preferably comprised of tin plated cold rolled steel. A printed circuit board 16 containing the electronic circuitry of the module preferably connects and attaches to the frame 20. A bottom cover 14 preferably comprised of tin plated cold rolled steel preferably attaches through the frame 20 to top cover 12 to complete the general assembly of the module housing 10 and may provide further shielding of the module 10.

Figure 4:
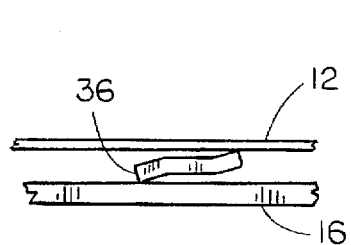
FIG. 4 is an illustration of the method of grounding of a PCMCIA type case to a printed circuit board utilizing the present invention.

FIG. 4 illustrates the manner in which a printed circuit board is connected and grounded to the outside cover of a PCMCIA type module. When the module assembly 10 as shown in FIG. 3 is completely assembled, the contacts 36 preferably provide physical and electrical connection between the top cover 12 and electrical contact pads (not shown) which may be disposed on and throughout the planar surface of the printed circuit board 16 at positions corresponding to the positions of the contacts 36. The plurality of contacts 36 provide a plurality of points at which the outer cover 12 of the PCMCIA type module 10 is grounded to the printed circuit board.

The contact pads on the printed circuit board to which contacts 36 connect may be the electrical grounding points of the circuitry contained on the printed circuit board. The grounding of the circuitry of the printed circuit board 16 through the multiplicity of contacts 36 to the electrically conductive outer cover 12 provides a high shielding continuity figure by which an approximation of an ideal gaussian surface for ideal electromagnetic shielding is approached. The number of grounding points which the present invention is many times greater than the number which prior PCMCIA grounding schemes provide. The physical connection of the contacts 36 to the outer cover 12 and to the PCB 16 is robustly maintained by the fasteners such as the, screws 22 of FIG. 1 which hold and fasten the module assembly 10. Thus, the means for connecting the grounding points is much simpler to accomplish than the mechanically cumbersome soldered metal spring clips provided in the art. The thus shielded PCMCIA type module 10 provides exemplary shielding of radio frequency waves, for example when the module 10 is an RF transceiver.

Figure 5:
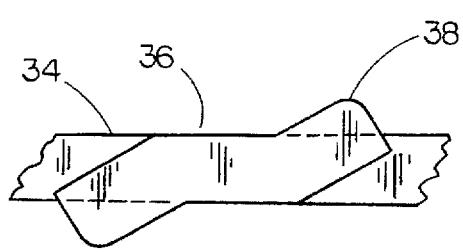
FIG. 5 is an illustration of the structure of a frame of a PCMCIA type module utilizing the present invention.

FIG. 5 illustrates the shape and contours of the connectors 36 of the present invention. The shape and contours of the contacts 36 are accomplished through an injection molding process. The contacts 36 are molded to have tabs 38 or molded-in ribs which are deflected at either end to extend above and below the planar surfaces of the rail 34 on which the contact 36 is formed. The extended tabs 38, or ribs, have rounded corners to thereby provide optimal physical contact with the outer cover 12 and with the PCB 16 as shown in FIG. 4. The electrical connection is preferably provided by a conductive coating which is preferably electroplated to the frame 20 after the injection molding process.

Figure 6:
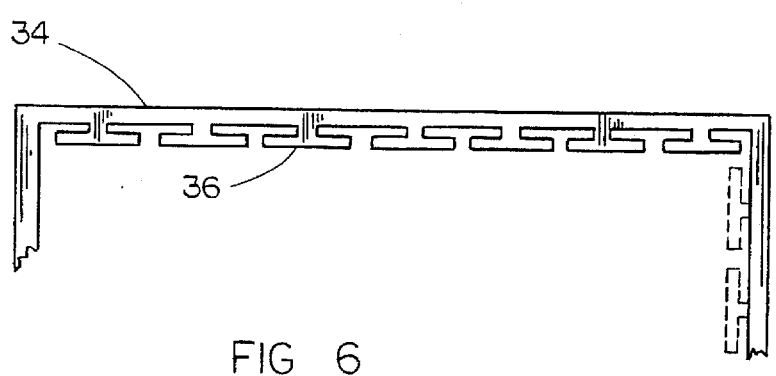
FIG. 6 is a top view of a frame of a PCMCIA type module utilizing the present invention.

FIG. 6 is a top plan view of the a frame of a PCMCIA type module which utilizes the present invention. The rail 34 may have a plurality of grounding contacts 36 formed on a side thereof. In an alternative embodiment of the present invention, the rail 34 may have formed thereon a plurality of grounding contacts 36 along the entire perimeter of the frame 20 as illustrated by the dashed lined grounding tabs.

In view of the above detailed description of a preferred embodiment and modifications thereof, various other modifications will now become apparent to those skilled in the art. The claims below encompass the disclosed embodiments and all reasonable modifications and variations without departing from the spirit and scope of the invention.

What is claimed is:

1. A shielded peripheral card module having multiple point grounding for use in a hand-held portable data terminal comprising:
   (a) an outer housing, said outer housing being electrically conductive;
   (b) an internal frame;
   (c) a circuit board, said circuit board containing the electronic circuitry of the peripheral card module; and
   (d) means disposed on said internal frame generally parallel to said circuit board for electrically connecting the electronic circuitry of said circuit board to said outer housing at a plurality of grounding points.

2. The shielded peripheral card module of claim 1 wherein said internal frame comprises injection molded plastic.

3. The shielded peripheral card module of claim 1 wherein said frame is coated with an electrically conductive material.

4. The shielded peripheral card module of claim 1 wherein said electrical connection means disposed on said internal frame includes contact tabs extendably deflected to thereby contact said outer housing and said circuit board.

5. A shielded peripheral card module for use in a hand-held portable data terminal, comprising:
   (a) a circuit board having at least one grounding region thereon;
   (b) first and second covers, said circuit board being disposed within said first and second covers, said first and second covers being electrically conductive and at least partially enclosing said circuit board to provide at least partial shielding of said circuit board; and
   (c) a frame having a pair of rails, said frame generally lying within a plane and being connected to said circuit board and to at least one of said first and second covers for mounting said circuit board within said first and second covers, each of said pair of rails having a contact extending therefrom generally within said plane, each of said contacts having at least one tab extending out of said plane, said at least one tab electrically connecting said grounding region to at least one of said first and second covers.

* * * * *